US006265880B1

United States Patent
Born et al.

(10) Patent No.: US 6,265,880 B1
(45) Date of Patent: Jul. 24, 2001

(54) APPARATUS AND METHOD FOR DETECTING CONDUIT CHAFING

(75) Inventors: Frank H. Born, Westernville; Roy F. Stratton, Oriskany, both of NY (US); Lamar R. Harris, Navarre, FL (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 09/334,122

(22) Filed: Jun. 15, 1999

(51) Int. Cl.[7] .................. H01H 31/12; H01H 31/02; G01R 27/08; H02H 5/04
(52) U.S. Cl. .................. 324/541; 324/525; 324/557; 324/720; 324/96; 361/103; 361/106
(58) Field of Search ........................ 324/525, 541, 324/557, 96, 720; 174/115; 361/103, 106

(56) References Cited

U.S. PATENT DOCUMENTS

| | | | |
|---|---|---|---|
| 4,301,399 | * 11/1981 | Miller et al. | 324/541 |
| 4,386,231 | * 5/1983 | Vokey | 174/115 |
| 4,891,597 | * 1/1990 | Asars | 324/557 |
| 4,918,977 | * 4/1990 | Takahashi et al. | 73/40.5 R |
| 4,950,957 | * 8/1990 | Asars et al. | 315/111.8 |
| 4,988,949 | * 1/1991 | Boenning et al. | 324/541 |
| 5,218,307 | * 6/1993 | Hiller | 324/541 |
| 5,323,117 | * 6/1994 | Endoh et al. | 324/551 |
| 5,469,066 | * 11/1995 | Ito et al. | 324/551 |
| 5,541,803 | 7/1996 | Pope, Jr. et al. | |
| 5,841,317 | 11/1998 | Watkins, Jr. et al. | |
| 5,862,030 | 1/1999 | Watkins, Jr. et al. | |

FOREIGN PATENT DOCUMENTS

2062446A * 10/1980 (EP) .

OTHER PUBLICATIONS

Tensolite; Tensolite announces availabilty of abrasion–sensing versions of patented Shortwatch Predictive Wire–Failure technology in Tufflite 2000 general purpose aircraft wire. News release, Aug. 9, 1999, 3 pages, St Augustine FL.

* cited by examiner

*Primary Examiner*—Glenn W. Brown
*Assistant Examiner*—Wasseem H. Hamdan
(74) *Attorney, Agent, or Firm*—Harold L. Burstyn; Joseph A. Mancini

(57) ABSTRACT

Apparatus and method to identify chafing of a conduit, thereby reducing the failure of any system which would be damaged or whose function would be impaired by abrasion of the conduit. Such a system may carry electrical power, fuel, other fluid, hydraulics, pneumatics, optical, or electromagnetic signals. Wear caused by rubbing against external structures is detected by wrapping the conduit with a sensing element, which may be a conductive wire, waveguide, fiber optic cable, or a tube (wound around the conduit or enclosing it) that holds a fluid under pressure. The sensing element is positioned so that chafing on the conduit electrically contacts, breaks, or punctures the sensing element well before the conduit fails. Measuring the end-to-end integrity of the sensing element or performing other tests on it determines whether a chafing object is present, the nature of the chafing object, and where on the conduit the chafing has occurred, thereby indicating that the conduit's integrity will be compromised unless remedial measures are taken.

8 Claims, 3 Drawing Sheets

APPARATUS AND METHOD FOR DETECTING CONDUIT CHAFING

STATEMENT OF GOVERNMENT INTEREST

The invention described herein may be manufactured and used by or for the Government for governmental purposes without the payment of any royalty thereon.

BACKGROUND OF THE INVENTION

The present invention relates to reducing the failure of a system that carries electrical, optical, or electromagnetic (as in waveguide) signals or that conveys fluids. In particular, it relates to failures of such a system that result from chafing of the conduits within it. Such a system may carry electrical power; fuel, refrigerant, other fluid; or optical and/or electromagnetic signals. Or the system may be hydraulic or pneumatic. Degradation or failure of such a system could also expose the systems around the conduit to adverse effects, as when a spark ignites the contents of a fuel container.

The outer surfaces of electrical, optical, and electromagnetic cables and cable bundles are frequently subject to wear caused by rubbing against external structures. If allowed to proceed, this wear can cause grounding, shorting, or breaking of the cable's internal structures (conductors or optical fibers). Hydraulic, pneumatic, and fuel or other fluid lines, pipes, and hoses are also susceptible to failure from chafing.

Each of these structures susceptible to chafing can be called a "conduit". This application uses the term conduit for any structure that can fail from chafing, such as a cable, cable bundle, hydraulic hose or pipe, pneumatic hose or pipe, or fuel/fluid hose or pipe.

A conduit often fails before a system's operator knows that the conduit has a chafing problem. Currently nothing is in wide use to detect when a conduit experiences chafing and thus becomes subject to failure. The disclosure of U. S. Pat. No. 4,988,949 is limited to detecting chafing on electrical cables against an electrically grounded structure under constant monitoring. It teaches nothing about either periodic testing or detecting chafing on any conduits other than electrical cables, nor does it detect chafing against a non-electrically grounded structure.

Thus there exists a need for a simpler apparatus and method of detecting chafing on any conduit that is likely to chafe against a non-electrically grounded structure or that requires only periodic monitoring.

SUMMARY OF THE INVENTION

Therefore, one object of the present invention is to provide a mechanism to detect chafing.

Another object of the present invention is to provide a mechanism to detect chafing prior to any damage to the internal structure of a conduit or to systems in the vicinity of the conduit.

Briefly stated, the present invention provides apparatus and method to detect chafing in a conduit, thereby reducing the failure of any system which would be damaged or whose function would be impaired or degraded by abrasion of the conduit. Such a system may carry electrical power, fuel, other fluid, optical or electromechanical signals, or it may be hydraulic or pneumatic. Wear caused by rubbing against external structures is detected by wrapping the conduit with a sensing element (conductive wire or fiber optic cable, or a tube to hold fluid under pressure; such a tube may be wound around the conduit, or it may enclose it.) The sensing element is positioned so that chafing on the conduit breaks or punctures the sensing element well before the conduit fails. Measuring the end to end integrity of the sensing element or performing other tests on it determines whether it has failed, thereby indicating that the conduit's integrity will be compromised unless remedial measures are taken.

According to an embodiment of the invention, a method for detecting chafing of a conduit comprises the steps of: placing adjacent the conduit an effective length of a medium, the medium being capable of conducting a signal, the medium being located so that a chafing object cannot substantially abrade the conduit without causing substantial damage to the medium; determining if there is end-to-end integrity of the medium, whereby lack of the integrity implies chafing; and if at least one of the conduit and the chafing object has an outer surface comprising electrically conductive material and the medium is electrically conductive, a further step, prior to the step of determining, of electrically isolating the medium from any other conductor.

According to a feature of the invention, a method for detecting chafing of a conduit comprises the steps of: placing adjacent to the conduit an effective length of electrically conductive wire, the wire being held substantially against the conduit so that a chafing object cannot substantially abrade the conduit without causing substantial damage to the wire; determining if there is end-to-end integrity of the wire, whereby lack of the integrity implies chafing; and if at least one of the conduit and the chafing object has an outer surface comprising electrically conductive material, a further step, prior to the step of determining, of electrically isolating the wire from any other conductor.

According to another feature of the invention, apparatus to detect chafing in a conduit, comprises: a sensing element placed adjacent to the conduit so that a chafing object cannot substantially abrade the conduit without causing substantial damage to the sensing element; and means for determining end-to-end integrity of the sensing element.

These and many other objects and advantages of the present invention will be readily apparent to one skilled in the pertinent art from the following detailed description of a preferred embodiment of the invention and the related drawings, in which like reference numerals designate the same elements.

DESCRIPTION OF THE PREFERRED EMBODIMENT

Figure 1:
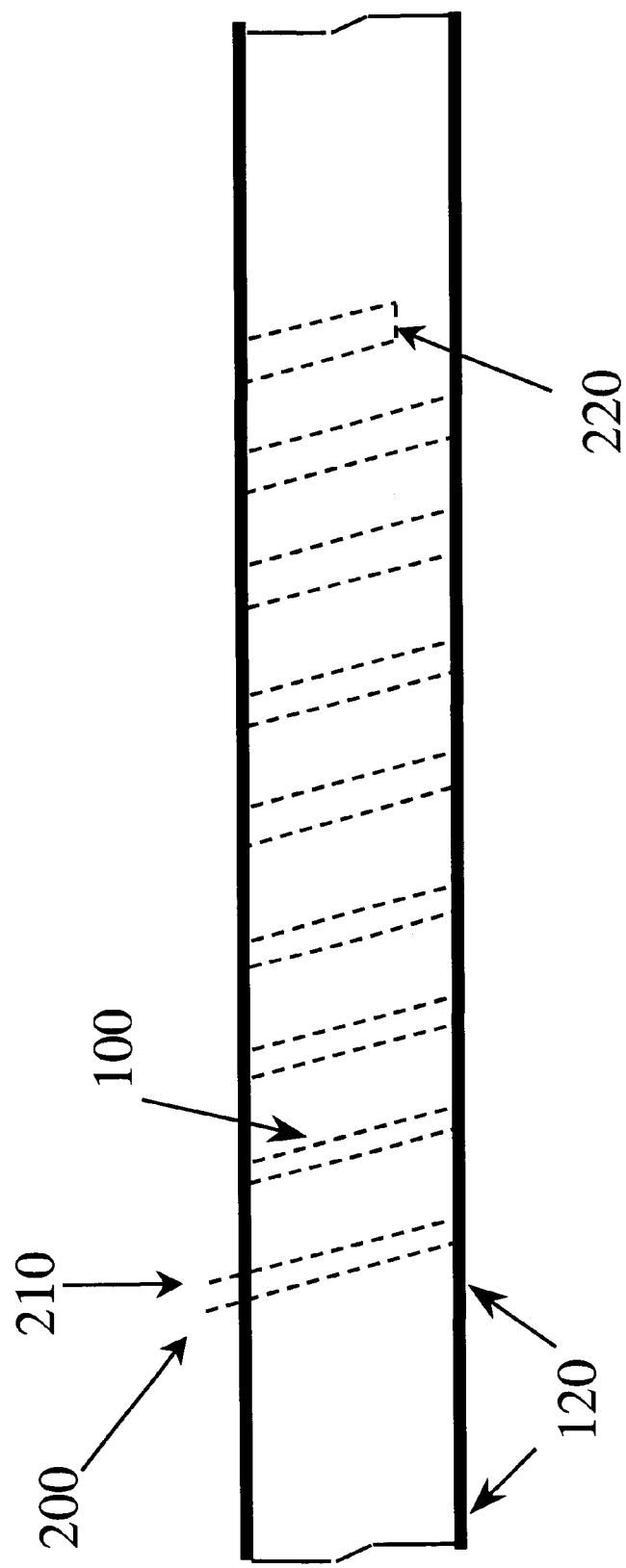
FIG. 1 shows a preferred embodiment of the invention whose sensing elements can be either conductive or optical.

Referring to FIG. 1, in a first embodiment of the present invention, chafing of a conduit 120 is detected by means of a manual readout. Conduit 120 can be any item that is susceptible to chafing, e.g., conductive or optical cable, cable bundle, fluid line (pipe or hose), hydraulic line or hose, pneumatic line or hose.

The manual read-out embodiment of the present invention uses an optical or conductive sensing element configured as follows. Conduit 120 is spirally wrapped with a sensing element 100. If sensing element 100 is electrically conducting, and conduit 120 has an outer layer that is electrically conducting, conduit 120 must be electrically insulated from sensing element 100. This can be done either by wrapping conduit 120 with an electrically insulating layer or by insulating sensing element 100 before wrapping it around conduit 120. Sensing element 100 extends from a first end 200 and is wrapped around conduit 120 so that it doubles back on itself at a point 220. Sensing element 100 has a second end 210 in close proximity to first end 200.

If sensing element 100 is conductive, it should not touch itself at any spot along the way. To do so would make it impossible to determine continuity beyond that point.

After conduit 120 is wrapped with sensing element 100, the whole assembly is covered with a layer of tape or other wrap to hold it in place. If sensing element 100 is conductive, this layer must be electrically insulating unless sensing element 100 is separately insulated.

Sensing element 100 is wrapped around conduit 120 so that any external structure that causes chafing contacts sensing element 100 and causes it to break. The fragility of sensing element 100 is chosen so that it breaks only after significant chafing has occurred but well before conduit 120's functional failure.

Sensing element 100 is configured relative to conduit 120 so that external structures in proximity to conduit 120, if they can cause chafing, impinge upon sensing element 100 before they significantly damage conduit 120 itself. Also, if sensing element 100 comprises an optical fiber, care must be taken to assure that the losses due to bending are not great enough to make it appear as if the fiber is broken. Thus optical fiber may not be usable on a small-diameter conduit.

In this embodiment, testing for end-to-end continuity of sensing element 100 detects chafing. This test is performed with simple optical or electrical test instruments, depending on the composition of sensing element 100. A simple optical test comprises injecting light into one end of the fiber and determining whether the light reaches the other end. A broken sensing element 100 indicates that chafing has occurred on conduit 120. Additional tests can be performed if sensing element 100 is conductive. Testing for voltage on conductive sensing element 100 or electrical grounding of conductive sensing element 100 can also indicate chafing.

Alternate Embodiment 1. It is not necessary to spirally wrap sensing element 100 around conduit 120. Sensing element 100 can extend in the axial direction of conduit 120 as long as sensing element 100 is in position to be chafed by any external structures that can cause chafing on conduit 120. By turning back on itself, sensing element 120 can make multiple passes axially along the conduit. Both first end 200 and second end 210 can be at the same end of conduit 120.

Alternate Embodiment 2. It is not necessary to have sensing element 100 double back on itself. Having first and second ends 200, 210 of sensing element 100 in close proximity to each other increases the ease of testing continuity of sensing element 100. Complex testing techniques, such as time-domain reflectometry, allow the verification of the end-to-end integrity of sensing element 100 without accessing both ends of sensing element 100. Doubling back of sensing element 100 also increases the likelihood of a conductive sensing element 100 touching itself, thereby disabling chafing detection beyond the point where sensing element 100 touches itself.

Alternate Embodiment 3. A plurality of sensing elements 100 can be especially helpful if sensing element 100 is not wrapped spirally around conduit 120. A plurality could sense chafing at different locations along conduit 120.

Alternate Embodiment 4. Sensing element 100 comprises a tube that, if punctured, indicates chafing of conduit 120. The test for chafing for this embodiment is whether the tube holds fluid pressure without significant leaks. Access anywhere along the tube suffices, provided a test point is available. Thus there is no advantage to having the tube double back on itself to end up in close proximity to where it started.

Alternate Embodiment 5. A tube concentric to conduit 120 could surround it and act as sensing element 100. Failure of the tube to hold fluid pressure without significant leaking indicates potential chafing on conduit 120.

Figure 2:
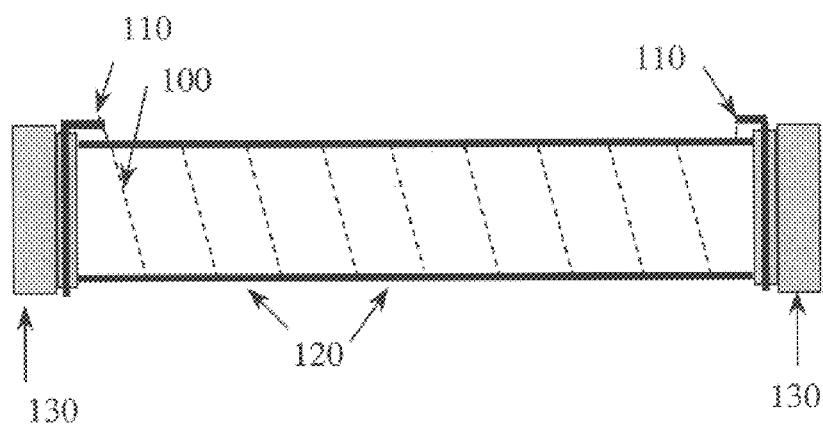
FIG. 2 shows how to detect chafing by a manual read-out that uses a conductive sensing element.

Alternate Embodiment 6. Making sensing element 100 conductive allows several other implementations: Referring to FIG. 2, chafing of conduit 120 is detected by a manual read-out from conductive sensing element 100. Conduit 120 can be any item susceptible to chafing, e.g., conductive or optical cable, cable bundle, fluid line (pipe or hose), hydraulic line or hose, pneumatic line or hose.

A manual read-out apparatus of the present invention whose sensing element 100 is conductive is configured as follows. Conduit 120 is spirally wrapped with sensing element 100 that is thin-gauge, electrically conducting, and uninsulated. If conduit 120 has an outer layer that is electrically conducting, conduit 120 must be insulated from conductive sensing element 100, either by wrapping conduit 120 with an electrically insulating layer or by insulating sensing element 100 before wrapping it around conduit 120. Conductive sensing element 100 extends from a first electrical ground 130, connected or in proximity to conduit 120, to a second electrical ground 130, connected or in proximity to conduit 120. A bridge 110 of known resistance makes each of conductive sensing element 100's connections to electrical grounds 130. Each end of conductive sensing element 100 typically terminates with the same resistance between it and electrical ground 130. After conduit 120 is wrapped with conductive sensing element 100, the whole assembly is covered with an electrically insulating layer. If conductive sensing element 100 is separately insulated, this layer is unnecessary if sensing element 100 is held rigidly in place.

Conductive sensing element 100 is wrapped around conduit 120 so that any external structure that causes chafing comes into contact with conductive sensing element 100 and causes it to break. The gauge of conductive sensing element 100 is chosen so that it breaks only after significant chafing has occurred but well before conduit 120's functional failure.

Conductive sensing element 100 must be configured relative to conduit 120 so that external structures in proximity to conduit 120, if they cause chafing, impinge upon conductive sensing element 100 before they damage conduit 120 itself.

Figure 3:
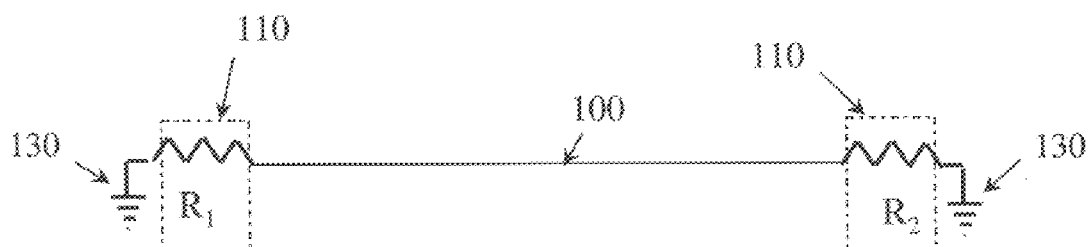
FIG. 3 shows a conductive sensing circuit of the present invention.

Referring to FIG. 3, the resistance of bridge 110 is selected so that one-half its value is much larger than the resistance of the entire length of conductive sensing element 100. (This value minimizes the degree of accuracy required of the test equipment.) The resistance of bridge 110 should also be large enough that shorting conductive sensing element 100 to a power line does not damage any of the systems involved. That is, where $R_B = R_1 = R_2$ = resistance of each bridge, and $R_S$ = total resistance of conductive sensing element 100, $R_S \ll R_B/2$.

Two general tests are applied to the configuration:

Test 1. Measure electrical resistance from any point on conductive sensing element 100 to electrical ground. The result should be approximately equal to, or slightly greater than $R_B/2$. Any other value indicates failure (allowing for normal drift and measurement errors).

Test 2. Measure the resistance from one end of conductive sensing element 100 to the other. The result should be small (but not zero) if we have chosen conductive sensing element 100 correctly; i.e., $0<R_S<<R/2$, where $R_S$ is the resistance of conductive sensing element 100. It is desirable (but not necessary) that conductive sensing element 100 have a resistance from about 20 ohms to 100 ohms. This value allows one to determine the approximate location of the chafing if one of the broken ends of conductive sensing element 100 is grounded. Unfortunately, in many cases this value requires that conductive sensing element 100 be excessively thin. Any measured value that differs from $R_S$ indicates failure.

To determine whether these tests apply, one must consider (1) the location of the rupture point of conductive sensing element 100 when it breaks from chafing and (2) the conductive properties of both conduit 120 and the chafing member. In a first possible case, the chafing member wears through the insulation on conductive sensing element 100 but has not yet broken it. In a second case, a line that carries electric current chafes conductive sensing element 100. In this case, the above tests must be preceded by a voltage test from conductive sensing element 100 to electrical ground. Any voltage found on conductive sensing element 100 shows a current is present. Since conductive sensing element 100 is probably insulated, presence of a current indicates chafing, possibly in its early stages. Both tests might detect chafing and grounding to either the chafing element or to conduit 120.

If chafing breaks conductive sensing element 100 into two portions, there are several possible cases:

Case 1: Both broken ends of conductive sensing element 100 are electrically floating. This means that they are not conductively contacting either conduit 120 or the chafing member. This is the most likely case. Both Test 1 and Test 2 (see above) work.

Case 2: One of the broken ends of conductive sensing element 100 is electrically floating (not connected to an electrical ground). The other is touching either an electrically conductive spot on conduit 120 or the chafing member. This is the second most likely case. Test 1 (see above) always works from one of the two portions of broken conductive sensing element 100. Test 1 also works from the other portion of conductive sensing element 100 unless the circumstances are exceptional. If the broken end of conductive sensing element 100 touches the conducting surface of either conduit 120 or the chafing member, and the broken end has a resistance through that surface to ground that almost exactly equals $R_B$, Test 1 will fail. But the probability is very small that conductive sensing element 100 is grounded through the exact resistance $R_B$. Test 2 (see above) always works.

Case 3. Both broken ends of conductive sensing element 100 touch either conduit 120 or the chafing member. This case breaks down into several variations.

Case 3, variation 1: Both broken ends contact an electrically insulating surface. Both Test 1 and Test 2 (see above) work.

Case 3, variation 2: One broken end of conductive sensing element 100 contacts an electrically insulating surface. The other broken end contacts an electrically conducting surface. Test 1 always works from one of the two portions of broken conductive sensing element 100. Test 1 also works from the other portion of conductive sensing element 100 unless the broken end (1) touches the conducting surface of either conduit 120 or the chafing member AND (2) has a resistance through that surface to ground almost exactly equal to $R_B$. Test 2 always works.

Case 3, variation 3: Both broken ends of conductive sensing element 100 are touching an electrically conducting surface. This variation breaks down into several versions.

Case 3, variation 3, version A: Both broken ends of conductive sensing element 100 are touching an electrically conducting surface that is electrically grounded. This is the most likely example of Case 3. Test 1 works. Test 2 will fail.

Case 3, variation 3, version B: Both broken ends of conductive sensing element 100 are touching a conducting surface. One broken end is floating (not connected to an electrical ground), and the other is grounded. Test 1 always works from one of the two portions of broken conductive sensing element 100. Test 1 also works from the other portion of conductive sensing element 100, unless the broken end of conductive sensing element 100 (1) is touching the conducting surface of either conduit 120 or the chafing member, AND (2) has a resistance through that surface to ground almost exactly equal to $R_B$. Test 2 always works.

Case 3, variation 3, version C: Both broken ends of conductive sensing element 100 contact an electrically conducting surface that is electrically floating (not connected to an electrical ground). Because electrically conducting elements are usually grounded, this version has a low probability. Since one does not expect either broken end to be in good contact with either conduit 120 or the chafing member, the probability that both are so connected is also low. This version breaks down into several examples.

Case 3, variation 3, version C, example 1: Both broken ends of conductive sensing element 100 contact different electrically conducting surfaces that are electrically floating. Both Test 1 and Test 2 work.

Case 3, variation 3, version C, example 2: Both ends of conductive sensing element 100 contact the same electrically floating conducting member. Or the broken ends contact different electrically floating conductive members that are connected non-resistively. Both Test 1 and Test 2 fail to detect the chafing that caused this condition. This example has a very low probability of occurring. If the two members are resistively coupled, both tests work if the resistance is high enough. If we ground the floating electrically-conductive member, Test 1 works; Test 2 does not.

Case 4: Conductive sensing element 100 is not broken, but chafing has worn through the insulation that covers it.

Case 4, variation 1: If conductive sensing element 100 is not in electrical contact with an electrically conducting chafing member, or the chafing member conducts but is electrically floating (not in contact with an electrical ground), Tests 1 and 2 will be unable to detect that chafing has occurred. Detection of chafing in this situation must wait until (1) conductive sensing element 100 comes into electrical contact with an electrically grounded member, (2) the test operator grounds the chafing member, or (3) conductive sensing element 100 breaks from the chafing.

Case 4, variation 2: If conductive sensing element 100 is in electrical contact with a grounded chafing member, Test 1 will indicate chafing, and Test 2 will indicate no chafing.

Case 4, variation 3: If conductive sensing element 100 is in contact with a conductive chafing member that is grounded through a resistance, Test 1 will indicate chafing; test 2 will not.

An example of this alternate embodiment used #24 AWG copper wire for sensing element 100 and 1000-ohm resistor bridges 110. Conductive sensing element 100 was wrapped spirally around conduit 120 with a 0.25 inch pitch, defined as the distance between consecutive windings of conductive sensing element 100 when measured parallel to the axis of conduit 120. The total length of conductive sensing element 100 was determined from the following formula:

$$S=(L/P)(\text{Square Root of } (p^2+(7r*D)^2))$$

where L=the length of conduit 120 to be wrapped with conductive sensing element 100, D=the diameter of conduit 120, and S=the total length of the conductive sensing element 100. For conduit 120 of length 10 feet and diameter ½, the length of conductive sensing element 100 would be approximately 64 feet. For #24 AWG copper wire, the resistance of conductive sensing element 100 is thus 1.65 ohms. This amount of resistance easily satisfies the criterion that the total resistance of conductive sensing element 100 be much less than one-half the resistance of resistive bridges 110.

The weight of sensing element 100 is also critical in some applications. For the above example, the weight of conductive sensing element 100 needed to wrap the ten-foot long, ½-inch diameter conduit 120 with a 0.25 inch pitch is approximately 1.24 ounces. Additional weight is added to the system by resistive bridges 110 and by the insulating wrap applied over the entire conduit 120/conductive sensing element 100 system. Teflon tape is a good choice for the insulating wrap. It is extremely light in weight, strong, and common in aircraft applications.

Figure 4:
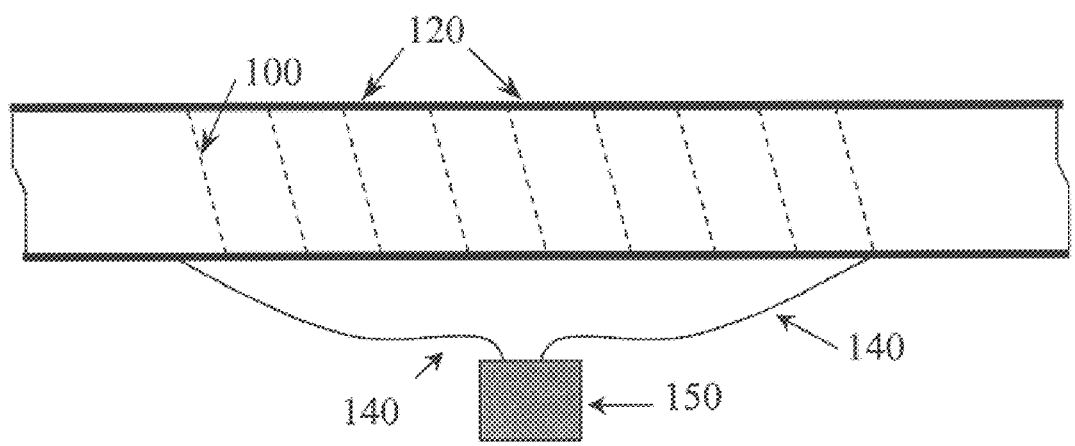
FIG. 4 shows a cable bundle configured with a sensing element that has extensions.

Alternate Embodiment 7. Referring to FIG. 4, to detect chafing by automatic readout we configure a system as follows. Conduit 120 is spirally wrapped with conductive sensing element 100 as in the first embodiment. Alternatively, sensing element 100 can be configured in other than a spiral wrap. All that is required is that a chafing member impinges on sensing element 100 prior to significantly damaging conduit 120. Conductive sensing element 100 is again a thin gauge, electrically conducting wire. If the outer layers of conduit 120 are electrically conducting, it must first be wrapped with an electrically insulating layer. Both ends 140 of conductive sensing element 100 are brought out to junction box 150, wherein circuitry automatically detects chafing. After conduit 120 is wrapped with conductive sensing element 100, the whole assembly is covered with an electrically insulating layer as in the previous embodiment.

Figure 5:
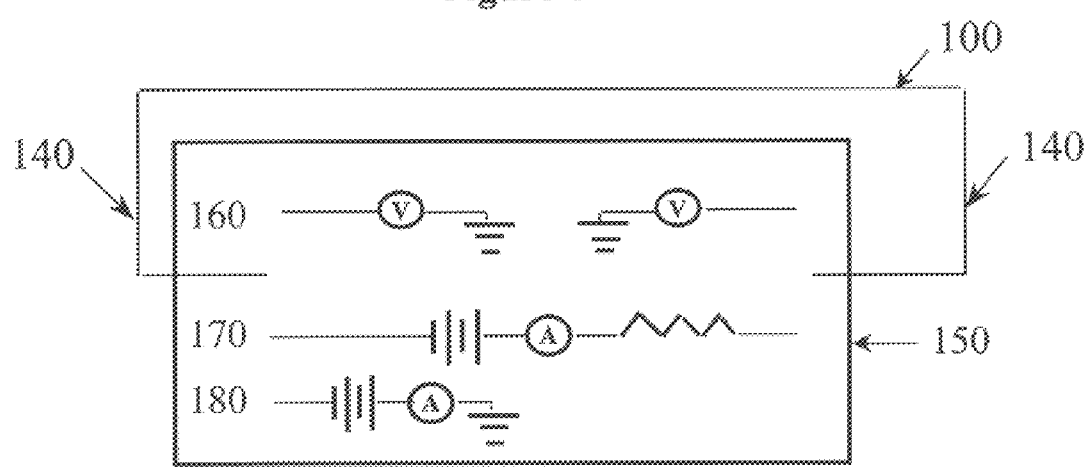
FIG. 5 shows a circuit of the present invention for automatic read-out.

In this embodiment, conductive sensing element 100 is wrapped around conduit 120 in the same manner as in the manual read-out embodiment. The difference between the two embodiments is that, for automatic readout, both ends 140 of conductive sensing element 100 are brought out to junction box 150, wherein automatic testing determines periodically whether chafing has occurred on conduit 120. Referring to FIG. 5, ends 140 of conductive sensing element 100 enter junction box 150, wherein circuits 160, 170, and 180 test for conditions that might be caused by chafing against conduit 120. Any or all of circuits 160, 170, and 180 can be used, depending on the types of chafing that are potential threats to conduit 120.

Circuit 160 tests for floating voltage caused by chafing, through the outer insulating layer surrounding conductive sensing element 100, that short-circuits it to a voltage source. Any voltage measured by a voltmeter in circuit 160 indicates chafing on conduit 120.

Circuit 170 tests for chafing on conduit 120 that has caused a break in conductive sensing element 100. A small voltage is applied to circuit 170, and the current is measured. No current means there is a break in conductive sensing element 100, probably from chafing.

Connecting one end 140 of conductive sensing element 100 to circuit 180 allows testing for chafing that results from electrical grounding. Any current in circuit 180 detected when a small voltage is applied indicates chafing has grounded out conductive sensing element 100.

If circuit 170 determines that there is a break in conductive sensing element 100, the distance of the break from the location of the read-out circuitry can be found with a Time Domain Reflectometer ("TDR"). If circuit 180 determines that conductive sensing element 100 is shorted to ground, a simple test of resistance determines the distance to the ground point, if the resistance per unit length of conductive sensing element 100 is known.

Alternate Embodiment 8. The automatic mode is reconfigured for manual readout. Referring again to FIG. 4, ends 140 of conductive sensing element 100 are fed to junction box 150. There the tests for chafing described above for Embodiment 2 are performed with a hand-held device.

Alternate Embodiment 9. To detect chafing by automatic readout we configure a system as follows. Sensing element 100 is an optical fiber placed adjacent to conduit 120 so that a chafing member impinges on sensing element 100 prior to significantly damaging conduit 120. We shine a continuous optical signal into one end of sensing element 100. An optical detector at the other end issues an alarm if the signal is interrupted.

Which embodiment to employ depends on the application. The choice should be made by system engineers familiar with the system to be protected.

All of the embodiments described above offer the following advantages over present techniques. The present invention detects chafing against virtually any structure external to conduit 120, whether or not conducting, whether or not grounded. The sensitivity of the present invention can be adjusted so that the detection of chafing allows a lead-time adequate to correct chafing prior to conduit 120's failure. The present invention can be implemented with varying instrumentation from fully automatic to fully manual. The manual embodiment of the present invention does not require a power source. The present invention detects chafing on a wide variety of conduits: electric or optical cables, fluid lines (pipes and hoses), hydraulic lines and hoses, and pneumatic lines and hoses.

The embodiments of the present invention that employ manual readout require only a commercially available hand-held tester. Testing by automatic readout can be instrumented in one or more of several implementations, depending on which failure mechanisms are likely to be present in the particular application. In many cases, the present invention allows rapid location of the chafing site with a simple electrical or optical TDR or resistance measurer.

Clearly many modifications and variations of the present invention are possible in light of the above teachings. It should therefore be understood that, within the scope of the inventive concept, the invention may be practiced otherwise than as specifically claimed.

What is claimed is:

1. A method for identifying chafing of a conduit using a medium, wherein said medium is selected from the group consisting of at least one of those mediums which are capable of supporting an electrical current and voltage, an electromagnetic signal, and an optical signal, comprising the steps of:

placing at least one said medium along the length of said conduit, wherein said medium has a first end and a second end, said medium being placed such that a chafing object contacts said medium prior contacting said conduit;

determining whether said chafing object has contacted said medium;

locating the approximate point on said conduit where said medium is chafed;

I. performing a first test sequence wherein said medium supports said electrical current and voltage and said electromagnetic signal, further comprising the steps of:

attaching a first resistor of resistance value $R_{B1}$ ohms between said first end and an electrical ground;

attaching a second resistor of resistance value $R_{B2}$ ohms between said second end and said electrical ground;

wherein said resistance value $R_{B1}$ ohms of said first resistor is equivalent to said resistance value $R_{B2}$ ohms of said second resistor such that $$R_{B1}=R_{B2}=R_B$$

measuring a resistance from a point on said medium to said electrical ground;

determining if said measured resistance is substantially equal to either $R_B/2$ or not, the possibilities being:

a. if said measured resistance substantially equals $R_B/2$, then either:
there is no chafing on said medium or
chafing exists but has not caused said medium to short to said electrical ground;

b. if said measured resistance does not substantially equal $R_B/2$, then chafing exists on said medium;

c. if said measured resistance substantially equals $R_B$, then said medium is broken and the one of said first and said second end connected to said point is electrically floating;

d. if said measured resistance substantially equals zero, then said medium is broken or chafed and either said break or said chafe on said medium is in contact with an electrically grounded member;

choosing whether or not to repeat said step of measuring and said step of determining on an opposite point of said medium;

if the choice is to repeat, then repeating said steps of measuring and determining;

II. performing a second test sequence wherein said medium supports said electrical current and voltage and said electromagnetic signal, further comprising the steps of:

accessing both said first and said second ends of said medium;

measuring a resistance between said first and said second ends of said medium, where:

a. if said measured resistance does not substantially equal $R_M$, the total resistance of said medium, then said medium is broken;

b. if said measured resistance substantially equals $R_M$, then either:
said medium is not broken or
said medium is broken and both ends of a break are contacting a conducting member OR
said medium is not broken but chafed by a non-conducting member or said conducting member;

III. performing a third test sequence wherein said medium supports said electrical current and voltage and said electromagnetic signal, further comprising the steps of:

attaching a first resistor of resistance value $R_{B1}$ ohms between said first end of said medium and said electrical ground;

attaching a second resistor of resistance value $R_{B2}$ ohms between said second end of said medium and said electrical ground;

wherein said said resistance value $R_{B1}$ ohms of said first resistor is not equivalent to said resistance value $R_{B2}$ ohms of said second resistor such that $$R_{B1} \neq R_{B2}$$

measuring a resistance from a point on said medium to said electrical ground;

determining, from said step of measuring, where:

a. if said resistance substantially equals $R_{B1}R_{B2}/(R_{B1}+R_{B2})$, then either:
there is no chafing on said medium or
chafing, exists but has not caused said medium to short to said electrical ground;

b. it said resistance does not substantially equal $R_{B1}R_{B2}/(R_{B1}+R_{B2})$, then chafing exists on said medium;

c. if said resistance substantially equals either $R_{B1}$ or $R_{B2}$, then said medium is broken and the one of said first and said second ends whose said attached resistor equals said resistance is electrically floating;

d. if said resistance substantially equals zero, then said medium is broken or chafed and either said break or said chafe on said medium is in contact with said electrically grounded member;

choosing whether or not to repeat said step of measuring and said step of determining on an opposite end of said medium; and if the choice is to repeat, then repeating said steps of measuring and determining.

2. The method of claim 1, wherein said step of locating further comprises attaching a Time Domain Reflectometer (TDR) to said first or said second end of said medium to determine the distance of chafing from said first or said second end, respectively, of said medium.

3. The method of claim 1, wherein said medium supports said electrical current and voltage and said electromagnetic signal, wherein, prior to said step of locating, a step or characterizing comprises:

applying a voltmeter to a point on said medium and measuring a voltage between said point and said electrical ground;

determining if said voltage is present on said medium, where:

a if said voltage is present, then either:
said medium is unbroken, chafed against, and still in contact with a voltage-carrying member or
said medium is broken into a first portion and a second portion and said first portion is chafed against and still in contact with said voltage-carrying member and said point is located on said first portion;

b. if no said voltage is present, then either:
said medium is not chafed against said voltage-carrying member or
said medium was chafed against said voltage-carrying member but is no longer in contact therewith or
said medium is broken into a first portion and a second portion, said second portion is chafed against and still in contact with said voltage-carrying member, and said point is located on said first portion;

choosing whether or not to repeat said step of applying, said step of measuring and said step of determining on an opposite end of said medium; and if the choice is to repeat, then repeating said steps of applying, measuring and determining.

4. The method of claim 1, wherein said medium supports said optical signal, said step of determining whether said chafing object has contacted said medium further comprises:

transmitting said optical signal within said medium, said optical signal having a known optical quality;

receiving said transmitted optical signal from said medium; and detecting if said optical signal substantially retains said known optical quality after being transmitted, the possibilities being:

a. if said transmitted optical signal is received and substantially retains said known optical quality, then either:
 said medium is not chafed or
 said medium is chafed but not penetrated;

b. if said transmitted optical signal is received but does not substantially retain said known optical quality, then:
 said medium is chafed and penetrated.

c. if said transmitted optical signal is not received, then:
 said medium is broken.

5. Apparatus for identifying chafing of a conduit using a medium, wherein said medium is selected from the group consisting of at least one of those mediums which are capable of supporting an electrical current and voltage, an electromagnetic signal, and an optical signal, comprising:

at least one said medium placed along the length of said conduit, said medium having a first end and a second end, said medium being placed such that a chafing object contacts said medium prior to contacting said conduit;

means for determining whether a chafing object has contacted said medium;

means for locating the approximate point on said conduit where said medium is chafed;

I. a first test sequence means wherein said medium supports said electrical current and voltage and said electromagnetic signal, further comprising:

a first resistor of resistance value $R_{B1}$ ohms attached between said first end of said medium and an electrical ground;

a second resistor of resistance value $R_{B2}$ ohms attached between said second end of said medium and said electrical ground;

wherein said resistance value $R_{B1}$ ohms of said first resistor is equivalent to said resistance value $R_{B2}$ ohms of said second resistor such that $$R_{B1}=R_{B2}=R_B$$

means for measuring a resistance from a point on said medium to said electrical ground;

means for determining if said measured resistance is substantially equal to either $R_B/2$ or not, the possibilities being:

a. if said measured resistance substantially equals $R_B/2$, then either:
 there is no chafing on said medium or
 chafing exists but has not caused said medium to short to said electrical ground;

b. if said measured resistance does not substantially equal $R_B/2$, then:
 chafing exists an said medium;

c. if said measured resistance substantially equals $R_B$, then:
 said medium is broken and the end connected to said point is electrically floating;

d. if said measured resistance substantially equals zero, then:
 said medium is broken or chafed and either said break or said chafe on said medium is in contact with an electrically grounded member;

means for applying said means for measuring and said means for determining to an opposite end of said medium;

II. a second test sequence means wherein said medium supports said electrical current and voltage and said electromagnetic signal, further comprising:

means for accessing both said first and said second ends;

means for measuring a resistance between said first and said second ends, where:

a. if said measured resistance does not substantially equal $R_M$, the total resistance of said medium, then said medium is broken;

b. if said measured resistance substantially equals $R_M$ then either:
 said medium is not broken or
 said medium is broken and both ends of a break are contacting a conducting member or
 said medium is not broken but chafed by a non-conducting member or said conducting member;

III. a third test sequence means wherein said medium supports said electrical current and voltage and said electromagnetic signal, further comprising:

a first resistor of resistance value $R_{B1}$ ohms attached between said first end and said electrical ground;

a second resistor of resistance value $R_{B2}$ ohms attached between said second end and said electrical ground;

wherein said resistance value $R_{B1}$ ohms of said first resistor is not equivalent to said resistance value $R_{B2}$ ohms of said second resistor such that $$R_{B1} \neq R_{B2}$$

means for measuring a resistance from a point on said medium to said electrical ground;

means for determining whether said measured resistance substantially equals $R_{B1}R_{B2}/(R_{B1}+R_{B2})$, where:

a. if said measured resistance substantially equals $R_{B1}R_{B2}/(R_{B1}+R_{B2})$, then either:
 there is no chafing on said medium or
 chafing exists but has not caused said medium to short to said electrical ground;

b. if said measured resistance does not substantially equal $R_{B1}R_{B2}/(R_{B1}+R_{B2})$, then chafing exists on said medium;

c. if said measured resistance substantially equals either $R_{B1}$ or $R_{B2}$, then said medium is broken and the one of said first and said second ends whose said attached resistor substantially equals said measured resistance is electrically floating;

d. if said measured resistance substantially equals zero then said medium is broken or chafed and either said break or said chafe on said medium is in contact with said electrically grounded member; and means for switching said means for measuring and said means for determining to an opposite end of said medium.

6. Apparatus as in claim 5, wherein said means for locating further comprises means for attaching a Time Domain Reflectometer (TDR) to said first or said second end of said medium to determine the distance of said chafing from said first or said second end, respectively, of said medium.

7. Apparatus as in claim 5, wherein said medium supports said electrical current and voltage and said electromagnetic signal, wherein said means for determining further comprises:

means for measuring a voltage between a point on said medium and said electrical ground;
  a. if said voltage is present, then:
    said medium is unbroken, chafed against, and still in contact with a voltage-carrying member or
    said medium is broken into a first portion and a second portion and said first portion is chafed against and still in contact with said voltage-carrying member and said point is located on said first portion;
  b. if no said voltage is present, then either:
    said medium is not chafed against said voltage-carrying member or
    said medium was chafed against said voltage-carrying member but is no longer in contact therewith or
    said medium is broken into a first portion and a second portion, said second portion is chafed against and still in contact with said voltage-carrying member, and said point is located on said first portion; and
means for switching said means for applying and said means for determining to an opposite end of said medium.

8. Apparatus as in claim 5, wherein said medium supports said optical signal, wherein said means for determining whether said chafing object has contacted said medium further comprises:

means for transmitting said optical signal within said medium, said optical signal having a known optical quality;
  means for receiving said transmitted optical signal from said medium; and
  means for detecting if said optical signal substantially retains said known optical quality after being transmitted, the possibilities being:
  a. if said transmitted optical signal is received and substantially retains said known optical quality, then either:
    said medium is not chafed or
    said medium is chafed but not penetrated;
  b. if said transmitted optical signal is received but does not substantially retain said known optical quality, then:
    said medium is chafed and penetrated;
  c. if said transmitted optical signal is not received, then:
    said medium is broken.

* * * * *